United States Patent [19]

Coleman

[11] 4,328,258
[45] May 4, 1982

[54] METHOD OF FORMING SEMICONDUCTING MATERIALS AND BARRIERS

[75] Inventor: John H. Coleman, Locust Valley, N.Y.

[73] Assignee: Plasma Physics Corp., Locust Valley, N.Y.

[21] Appl. No.: 88,100

[22] Filed: Oct. 24, 1979

Related U.S. Application Data

[62] Division of Ser. No. 857,690, Dec. 5, 1977, Pat. No. 4,226,897.

[51] Int. Cl.³ ............................................. C23C 11/00
[52] U.S. Cl. ...................................... 427/39; 204/164; 118/50.1; 118/723
[58] Field of Search ........................ 427/38, 39, 40, 84, 427/85, 86; 204/164, 165, 168, 192 N, 192 S, 192 R; 118/50.1, 723

[56] References Cited

U.S. PATENT DOCUMENTS

| | | | |
|---|---|---|---|
| 2,097,233 | 10/1937 | Meston | 204/192 R |
| 2,636,855 | 4/1953 | Schwarz | 204/192 S |
| 3,371,649 | 3/1968 | Gowen | 118/723 |
| 3,437,511 | 4/1969 | Hough | 427/39 |
| 3,594,238 | 7/1971 | Hoechelman | |
| 3,655,438 | 4/1972 | Sterling et al. | 427/39 |
| 3,739,220 | 6/1973 | Jones | |
| 4,033,287 | 7/1977 | Alexander et al. | 118/723 |
| 4,059,461 | 11/1977 | Fan et al. | 427/86 |
| 4,064,521 | 12/1977 | Carlson | 357/2 |

FOREIGN PATENT DOCUMENTS

| | | |
|---|---|---|
| 2538300 | 3/1977 | Fed. Rep. of Germany. |
| 1438826 | 4/1966 | France. |
| 1493110 | 7/1967 | France. |
| 1508795 | 11/1967 | France. |
| 2339001 | 8/1977 | France. |
| 48-2831 | 1/1973 | Japan ................. 427/86 |
| 5256083 | 10/1975 | Japan ................. 118/723 |
| 933549 | 8/1963 | United Kingdom ........ 427/41 |

OTHER PUBLICATIONS

Oppel et al., "Metallober Flachen", vol. 30, No. 2, (1976), pp. 64-68.
Carlson, "Journ. of the Electrochem. Soc.", vol. 122, No. 10, (Oct. 1975), pp. 1334-1337.
Rosler et al., "Solid State Technology", Jun. 1976, pp. 45-50.
Fritzsche et al., "Solid State Technology", Jan. 1978, pp. 55-59.
Chittick, "Journ. of Non-Crystalline Solids", 255-270.

*Primary Examiner*—John H. Newsome

[57] ABSTRACT

In a gaseous glow-discharge process for coating a substrate with semiconductor material, a variable electric field in the region of the substrate and the pressure of the gaseous material are controlled to produce a uniform coating having useful semiconducting properties. Electrodes having concave and cylindrical configurations are used to produce a spacially varying electric field. Twin electrodes are used to enable the use of an AC power supply and collect a substantial part of the coating on the substrate. Solid semiconductor material is evaporated and sputtered into the glow discharge to control the discharge and improve the coating. Schottky barrier and solar cell structures are fabricated from the semiconductor coating. Activated nitrogen species is used to increase the barrier height of Schottky barriers.

23 Claims, 12 Drawing Figures

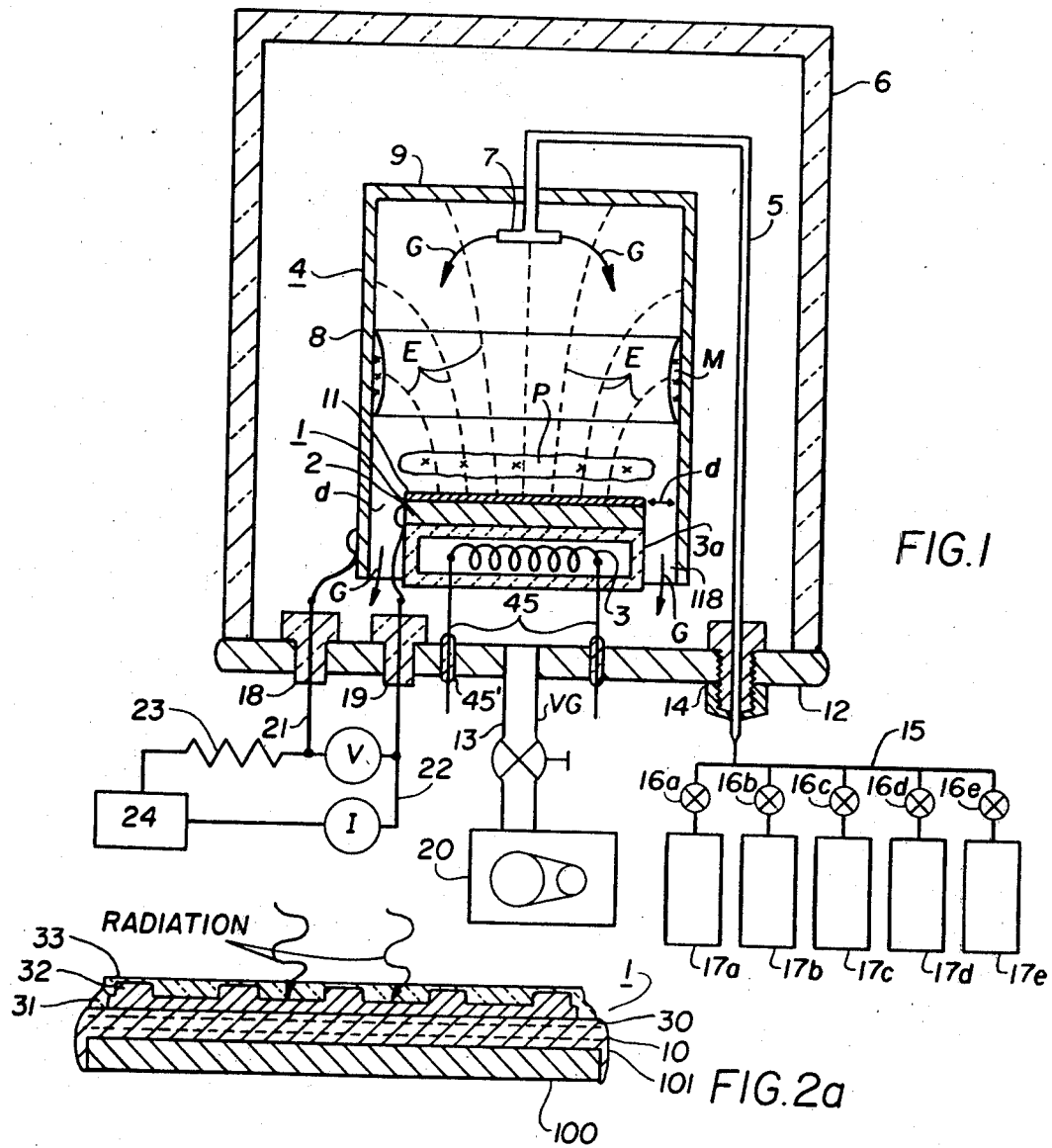
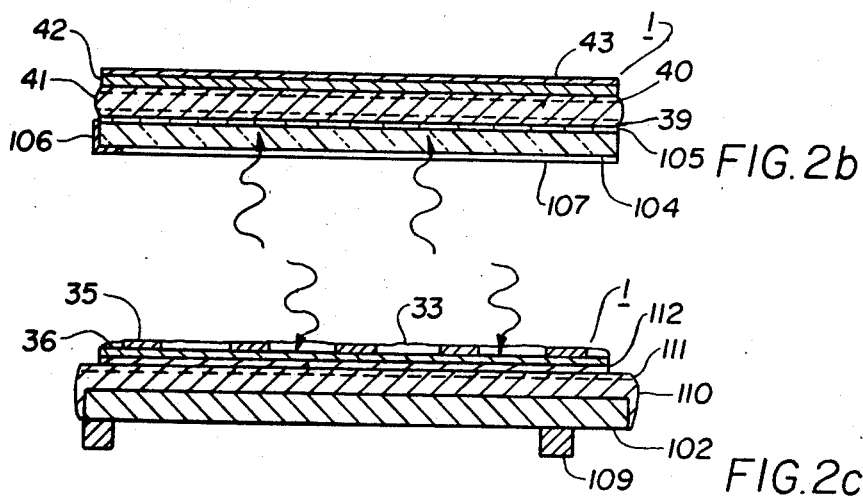

METHOD OF FORMING SEMICONDUCTING MATERIALS AND BARRIERS

This is a divisional of application Ser. No. 857,690, filed Dec. 5, 1977 now U.S. Pat. No. 4,226,897.

BACKGROUND OF THE INVENTION

Hydrogenated amorphous silicon films, hereinafter called a-Si, which are suitable for semiconductor applications have been prepared by a variety of techniques. Chittick, Alexander, and Sterling reported in the *Journal of the Electrochemical Society*, Vol 116, No. 1 (January 1969) pages 77-81, in an article entitled "The Preparation of Properties of Amorphous Silicon", that an inductively coupled, RF glow-discharge in silane ($SiH_4$) gas produced low-conductivity a-Si films that could be doped with both donor and acceptor impurities, thereby changing the a-Si conductivity over a wide range of values. More recently, a-Si films were produced by evaporating silicon in an atmosphere of hydrogen ($H_2$) and by sputtering silicon in an atmosphere of $H_2+Ar$ which exhibited similar semiconductor characteristics to those films made from silane in a glow-discharge.

Presently, several commercial projects related to the development of Schottky barrier solar cells using crystal, polycrystal, and amorphous semiconductor materials were described in a recent book entitled *Twelfth IEEE Photovoltaic Specialists Conference*—1976, published by the Institute of Electronic and Electrical Engineers Inc., New York, N.Y., 10017. On pages 893-895 of this book, Carlson et al reported in an article entitled "Solar Cells Using Schottky Barriers on Amorphous Silicon" that he formed a solar cell by applying a transparent electrode with appropriate work-function to one side of an a-Si film and an ohmic contact to the other. Also, this article stated output voltages increased initially by 100 mV when the thin metal electrode was evaporated in residual oxygen background in the vacuum system, producing a metal-insulator-semiconductor (MIS) structure. More recently, Carlson reported in Vol 77-2 *Extended Abstracts, Fall Meeting, Atlanta, Ga., Oct.* 9-14, 1977 of the Electrochemical Society, Princeton, N.J., 08540, pages 791-792, that these MIS cells were generally unstable. Furthermore, Carlson reported that his electrodes were less than 0.02 $cm^2$ in area—a value too small for commercial use. Also, in article by Godfrey & Green in *Applied Physics Letters* Vol 31, No. 10, (Nov. 15, 1977) pages 705-707, indicates that such small areas lead to erroneous data. My prior glow-discharge coating processes are covered in U.S. Pat. Nos. 3,068,283, 3,068,510 (Dec. 18, 1962) and 3,600,122 (Aug. 17, 1971). These processes generally related to polymeric coatings which have resistivities greater than $10^{12}$ ohm-cm High-resistivity coatings act as blocking capacitance in series with the glow-discharge thereby assisting in regulation of coating uniformity. However, neither 60 Hz line transformers nor DC power supplies can be used with my prior processes. The present process, on the other hand, produce semiconducting films which act primarily as resistances in series with the glow discharge and which require different process concepts.

SUMMARY OF THE INVENTION

The present coating process is related to producing semiconductor films which have electrical resistivities generally less than about $10^{12}$ ohm-cm at room-temperature, and preferably between $10^{12}$ and $10^6$ ohm-cm. The present process is designed to produce uniform semiconducting coating over a large area by means of a glow-discharge in which pressure and electric field are controlled. Also, the present process relates to the treatment of a semiconductor surface to increase the Schottky barrier voltage when an active conducting coating is applied. Such treatment may be used on any semiconductor material, including crystal semiconductor which have conductivities of 100 and 0.01 ohm cm. and higher. My coating process and barrier treatment is particularly useful for producing a Schottky barrier solar cell.

The principle object of the process is to produce a semiconductor and barrier for use in a solar cell. Another object of the invention is to coat a large-area substrate with amorphous semiconducting material. Yet another object is to form a Schottky barrier between a semiconducting material and an active electrode. Another object is to dope large area amorphous semiconductor materials to form an ohmic contact with a conducting substrate. Another object is to introduce semiconductor material from a solid-source into a coating being formed by glow-discharge deposition from the gas-phase.

BRIEF DESCRIPTION OF THE DRAWING

FIG. 1 is a cross-sectional view of apparatus illustrating glow-discharge in the weak electric field.

FIGS. 2a-2c are cross-sectional views of devices using semiconductor material produced in a glow-discharge and treated with activated nitrogen.

DESCRIPTION OF THE APPARATUS AND TECHNIQUES

Figure 3:
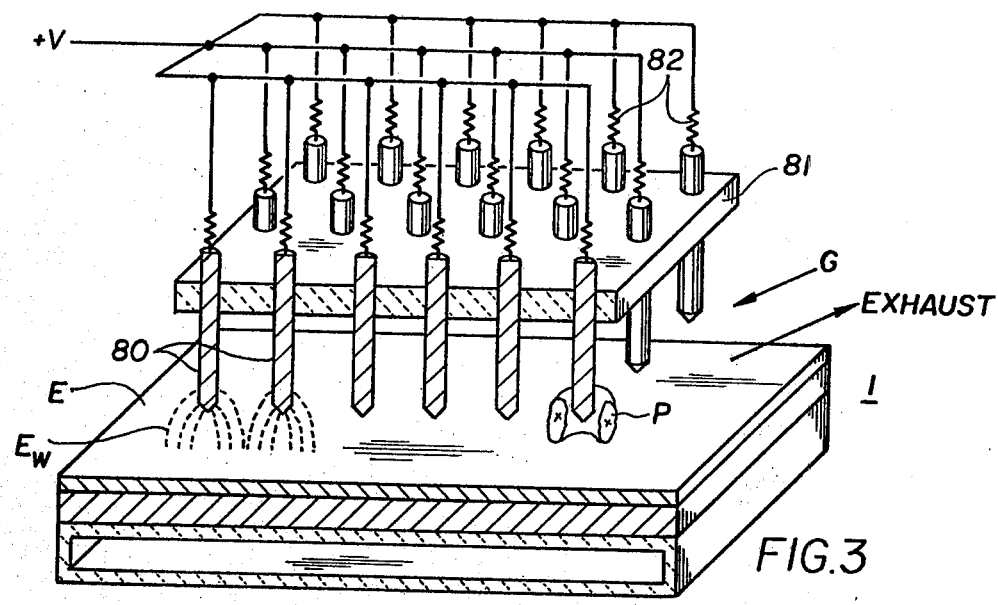
FIG. 3 illustrates another embodiment of the invention in which multiple electrodes are employed to maintain a glow-discharge.

Referring to FIG. 1 and FIG. 2a, cross-sectional views are illustrated of the glow-discharge apparatus and a typical device made therein. The substrate 1 is a 0.010" thick stainless-steel plate 11 with rectangular dimensions of 3"×4" supported by electrode 2. Resistance heater 3 is embedded in ceramic block 3a which supports and heats electrodes 2, 11. Substrate 1 is positioned in the open face of concave counter electrode 4 which has a rectangular cross-section of 4"×5" defined by side-walls 8 and top 9. Top 9 is positioned at least 4½" above the front surface of substrate 11. Electrode assemblies 1 and 4 are positioned inside an enclosure 6 and header 12 and are joined by appropriate gasket to form a gastight seal. Vacuum pump 20 is connected through valve and nipple 13 to header 12 to evacuate enclosure 6. Gases G from tanks 17 a–e are conducted through regulated needle valves 16 a–e, manifold line 15, and connector through header 12 into enclosure 6. Here, gases G are conducted through dielectric tubing 5 and diffusor 7 inside electrode 4. A gap 118 of say $\frac{1}{2}''$ between walls 8 and electrode 2 permits egress of gases G after passing through glow-discharge P. Guage VG meters the evaluation of enclosure 6 and pressure of gases G. Guage VG is preferably of the capacitance-manometer type which is commercially available for use with corrosive, condensible gases in the range of 0.001 to 10 Torr. Readings from gauge VG may automatically regulate valves 16 through a servo-mechanism to maintain a desired pressure. A potential V is applied between electrodes 2, 4 from power supply 24 by leads 21, 22 connected through insulated electrical bushings 18, 19 sealed in header 12. Protective network 23 prevents damaging sparks. Voltage V and current I are metered as indicated. Resistance heater 3 enclosed in ceramic 3a is connected through leads 45 and electrical bushings 45' to an appropriate power source (not shown).

In operation, the enclosure 6 is evacuated by pump 20 to a pressure below about 0.02 Torr and back-filled with silane (SiH$_4$) from tank 17a by opening valve 16a. Valve 16a is adjusted to maintain the desired pressure in enclosure 6 which, for example, may be $\frac{1}{2}$ Torr. Next a mixture of 10% phosphine (PH$_3$) in helium (He) from tank 17b is admitted into manifold 15 where it mixes with silane and flows through lines 5, 7 to raise the system pressure PG to about 1 Torr. The potential difference V between electrodes 2, 4 is adjusted to about 530 volts initiating a glow-discharge and the current, I adjusted to about 5 mA, to produce a heavily doped n+ coating 101 on plate 100. After maintaining the discharge for about 1 minute, valve 16b is closed to shut off the flow of PH$_3$ and He leaving silane alone. The uniformity and impurity level of ohmic-layer 101 is not as critical as that of the high-resistivity a-Si layer 10. Therefore, ohmic-layer 101 may be deposited by conventional, doped chemical-vapor-deposition (CVD) or other techniques, prior to insertion in the apparatus of FIG. 1.

Next, the pressure PG of silane is adjusted to 0.3 to 0.4 Torr to position a diffuse discharge P in the region above plate 100 and minimize the discharge in the region of closest separation d between electrodes 2, 4. The discharge then occurs in the weaker region of the electric-field E as will be discussed in more detail in connection with FIG. 5b. The discharge is maintained for 40 minutes at 5 mA to 10 mA (0.1 to 0.2 mA/Cm$^2$) with V in the range of 500–1500 depending on PG. After desired thickness on substrate 1 is attained, valve 16b is closed and the residual gases evacuated to background by pump 20. Valve 16c on ammonia (NH$_3$) tank 17c is opened to admit NH$_3$ into the substrate region 1 to a pressure of about 400 Torr. A potential difference V is applied between electrodes 2, 4 of about 350 volts and I of 5 mA to 10 mA (0.1 to 0.2 mA/Cm$^2$) produce to a glow-discharge adjacent coated substrate 1. Valve 16c is closed, the residual gases in enclosure 6 evacuated by pump 20, and the enclosure 6 is backfilled with nitrogen from tank 17d (valve 16d) to purge unreacted silane. Valve 13 is closed, jar 6 raised to atmospheric pressure and substrate 1 removed.

Referring to FIG. 2a, the substrate 1 is illustrated with foil 100 coated with n+-doped a-Si layer 101, undoped 1–4 $\mu$m a-Si layer 10 and ammonia-treated layer 30. The substrate 1 is then placed in a conventional vacuum-evaporator and coated with a high work-function, semi-transparent metal 31 (such as palladium) to a thickness of about 100 A or less to complete the Schottky barrier. The conducting layer 31 is adjusted to be thick enough to reduce its sheet resistance while not absorbing an inordinate amount of incident photons. A grid 32 of thicker metal such as a silvertitanium alloy (Ag-Ti) is applied to reduce the series resistance of the semi-transparent electrode 31. Also, a top anti-reflection (AR) layer 33 such as Si$_3$N$_4$ with a thickness range of about 1000 A° may be applied to electrode 31 to reduce reflection loss under photon irradiation. Under test using AM1 illumination and a Tektronics Corp. curve tracer, the short-circuit current Isc was measured to be about 2 mA/cm$^2$ and the open-circuit voltage Voc was about 350 mV, with no AR coating and 50% reflection loss. When the layer 30 was added by the NH$_3$ discharge, Isc remained about 2 mA/cm$^2$ while the Voc was measured to be greater than 600 mv—an increase in excess of 250 mV, again with no AR coating. Similar increases were found with other substrates as illustrated in the following drawings.

Referring to FIG. 2b, a glass substrate 104 coated with a transparent conducting coating 105 of the oxides of indium (In) and tin (Sn) (commercially available) may be inserted into the apparatus of FIG. 1 on electrode 2 with the conducting coating 105 facing the discharge and conducting tab 106 contacting electrode 2. Thereafter, the coating procedure is the same as that described in connection with FIG. 2a, in that ohmic contact layer 39, a-Si layer 40, NH$_3$-treated barrier-layer 41 are produced sequentially. Also, using an evaporator, a Pd coating 42 is applied to complete the Schottky barrier and a thicker metallic layer 43 such as Ti-Ag applied to complete the contact. When substrate 1 is illuminated (in operation) through the glass substrate 104, electrode 43 may be opaque. An additional AR coating 107, such as an oxide of tantalum, may be applied to the glass. Although the glass substrate 104 serves as a useful protective material, the configuration of FIG. 2b produces somewhat less output than that of FIG. 2a since the maximum number of charge carriers are generated at the ohmic surface where the incident photons impinge first rather than at the barrier where the output potential is developed.

Referring again to FIG. 2a, b, p-type a-Si may be substituted for the n-type a-Si in coatings 10, 40 by doping with a donor impurity during formation in the apparatus in FIG. 1. For example, during formation of the a-Si coating 10, the apparatus of FIG. 1 may be operated as described above except that diborane from tank 17e (valve 16e) is added to the silane flow from tank 17b to dope the a-Si layer 10 to neutral or to p-type depending on the fractional amount of B/Si. Correspondingly, 1–10% diborane from tank 17e may be added to G to dope the ohmic-layer 101 to p+ level. For p-type a-Si, the active metal layer 31 is formed from a low work-function metal such as chromium (Cr) or aluminum (Al). In either case the layer 101 may be formed by NH$_3$-discharge to enhance the Schottky barrier with any of the structures such as shown in FIG. 2a, b, c.

Referring again to the apparatus of FIG. 1, I found that barrier-height and Voc of an untreated a-Si material may be increased by glow-discharging in $N_2$ gas instead of $NH_3$. However, using the structure of FIG. 2a, when layer 30 was formed from a $N_2$ discharge the increase in Voc amounts to only about 100 mV instead of 250 mV with $NH_3$. Also, nitrogen atoms (N.) produced an increased barrier. For example, using a commercial plasma torch producing a nitrogen atom beam to treat the surface 10, Voc increased by 150 mV after 15 minutes treatment. This value is somewhat larger than the direct $N_2$ discharge but smaller than the 250 mV under direct $NH_3$ glow-discharge. Hydrazene proved more effective than $N_2$ alone. Air in an atomic beam was found to increase the Voc also; however, oxygen alone in a glow-discharge formed a blocking layer. The discharge for producing the $NH_3$ treated layer 30 is not as critical as that for producing the a-Si layer 10 since the gases, per se, do not form a film but combine with the coating 10, deposited previously. The glow-discharge time-limits are determined by the limiting thickness through which charge carriers can tunnel.

Referring to FIG. 2c, the substrate 1 is 0.0035" thick stainless-steel foil 102 reinforced with frame 109 which may be 1/16" or thicker, to prevent foil 102 from bending in a small radius and damaging the a-Si film 110. Again, a barrier layer 111 is formed by discharge treatment in ammonia. However, an additional barrier layer 112 is added which may be antimony trioxide ($Sb_2O_3$) or titanium dioxide ($TiO_2$) or other metallic oxides or nitrides having a thickness 50 A° or less to enhance the barrier height without blocking the desired charge carriers. In the case of $TiO_2$, the semi-transparent layer 36 may be nickel (Ni) with a thickness 100 A° or less and may have an additional conducting layer of 50 A° or so of chromium (not shown). Contact fingers 35 and AR coating 33 are added to complete the photo-voltaic Schottky barrier. The cells of FIG. 2a, b, c may be made with any semiconductor material having a photoresponsive barrier such as that made in the following apparatus. Referring to FIG. 3, the anode 4 of FIG. 1 is replaced by a set of cylindrical pins 80 supported by a dielectric holder 81. Each pin 80 is connected through protective resistors 82 to +V. The surfaces of dielectric holder 81 and resistors 42 are positioned at least about 6" above the substrate 1 to advoid deposition of conducting silicon material (M noted in FIG. 1). Typical operating conditions are similar to those described in connection with FIG. 1 in that the desired gases G are admitted through a suitable distributor (not shown) and exhausted by a pump (not shown) except that the pressure and current density can be operated at higher values say up to 2 Torr 1 mA/cm² and higher. Also, substrate 1 can be moved through the discharge for continuous coating or may remain static. Again, the fringing field lines E permit the discharge to move up the pins 80 by adjustment of pressure while maintaining the discharge in the weaker field $E_w$.

Other geometries can be used for pins 40 such as tapered pins or hollow cylinders facing the substrate 1. Silicon which is collected on the pins 40 represents wasted material. However, I found that by applying DC or DC plus AC with the pins 40 biased anodically, silicon collection is minimized. For designing protective resistors 42, if the average current densities (I/area) to substrate 1 is adjusted to be 0.2 mA/cm² and with pins 40 1 cm apart, resistors may be in the range of 100 k ohms for good regulation. Hollow pins are described with a moving substrate in FIG. 4.

Figure 4:
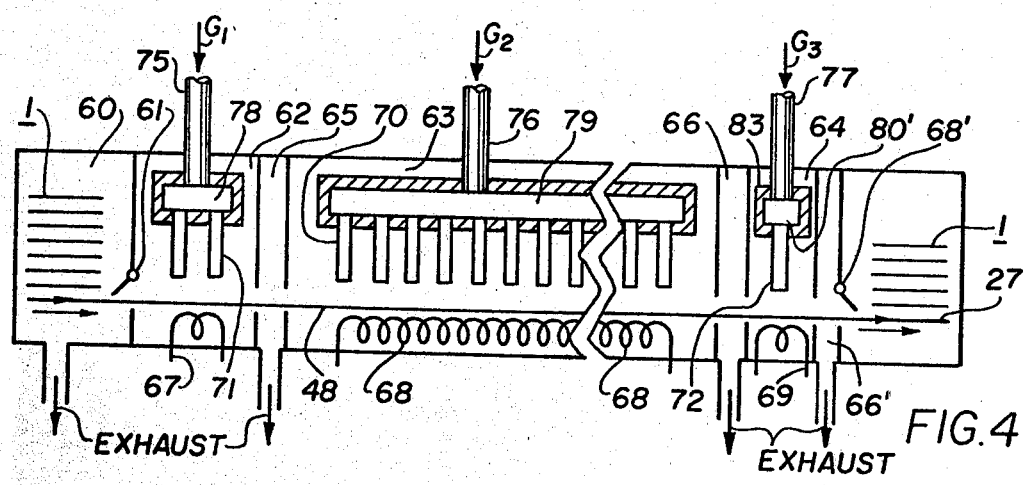
FIG. 4 illustrates another embodiment in which the substrate is moved through the glow-discharge.

Referring to FIG. 4, an in-line system is illustrated schematically using hollow electrodes 70 with configuration similar to that in FIG. 3. A loading chamber 60, airlock 61, ohmic-layer deposition system 62, and a-Si deposition-system 63 produce continuously coated substrates 1 such as those shown in FIG. 2a, b, c. Finally, chamber 64 treats the coated substrate with activated ammonia species to form the barrier-layer. Appropriate gases G1, G2, G3 are distributed through lines 75, 76, 77 into ceramic chambers 78, 79, and 80 which may conveniently house electrodes 71, 72, 73 respectively. The gases from distributors 78, 79, 80 flow through hollow pins 71, 72, 70 into pumping ports 65, 66 and are exhausted by pumps (not shown). Pressures in ports 65, 66 are adjusted to be below that in compartments 62, 63, 64 to insure that the exhaust gases G do not flow into adjacent compartments. In operation, the size of each compartment 62, 63, and 64 is adjusted to the discharge residence time to produce the desired coating thickness. Resistance heaters 67, 68, 69 maintain the substrate 1 at the desired temperature. The temperature of the substrate 1 in the a-Si region 63 should be between 200° and 350° C., whereas the temperature in the ohmic-layer region 62 can be considerably higher. The temperature in the $NH_3$ region 66 should be below about 300° to advoid dehydrogenation of the a-Si.

In operation, airlock 61 is closed and the substrate 1 which, for example, are one meter square stainless steel plates, are loaded in chamber 60 and the air is evacuated. Air lock 61 is opened and a commercial feeder mechanism (not shown) moves the substrate 1 along guide-rail 48 which acts as the electrical connection to ground for substrate 1. Suitable mechanical mechanisms include individual moving armatures, endless conveyor belts and ultrasonic walkers. Substrate 1 is unloaded and collected in a stacking mechanism (not shown) in compartment 27. Air lock 68 is closed and coated substrates 1 moved to the evaporation system as described in connection with FIG. 1. Alternatively, loading and unloading compartments 60, 27 could be replaced with continuous seals, which are standard in the vacuum coating industry, to provide vacuum to air operation. Other suitable electrode configurations such as those described in FIG. 5 may be used with a moving substrate.

Figure 5A:
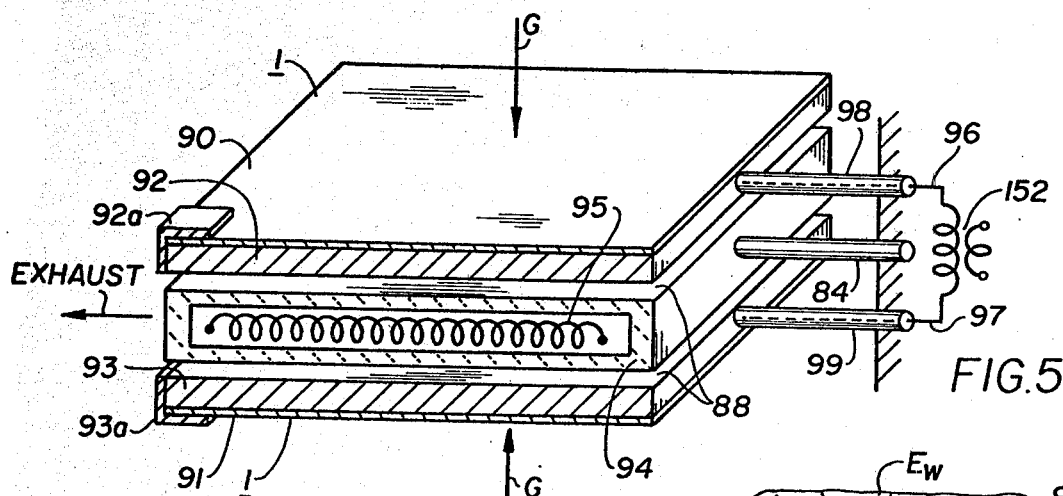
FIGS. 5a and 5b illustrate other embodiments in which the electric field configuration and pressure are adjusted to enable alternating voltages to be applied while collecting a substantial part of the semiconducting material.

Referring to FIG. 5a, the preferred embodiment, electrodes are illustrated which enable the use of AC and efficient collection on the substrate 1 of a substantial part of the a-Si. Parallel, rectangular electrodes 92, 93 hold stainless steel plates 90, 91 forming substrate assembly 1. End tabs 92a, 93a on electrodes 92, 93 insure good electrical contact to substrates 90, 91 and may act as guides if substrates 90, 91 are moved during deposition. Electrical contact to electrodes 92, 93 is made by leads 96, 97 having ceramic insulators 98, 99. Leads 96, 97 are connected to center-tapped transformer 152. The plates may be supported by leads 96, 97 and additional insulators (not shown). Electrodes 92 are heated, for simplification of the illustration, by resistance-heater 95, ceramic insulation 94, and supported by a suitable ceramic rod 84. A small gap 88 is maintained between heater insulation 94 and electrodes 92, 93 to avoid short-circuiting electrodes 92, 93 through conducting Si, which deposits on insulation 94. Also, dielectric members 98, 99, and 84 should extend a distance greater than about 6" from the region of electrodes 90, 91 under glow-discharge. Input gases G are distributed and exhausted from lines (not shown) as described in connection with FIG. 1.

Figure 5B:
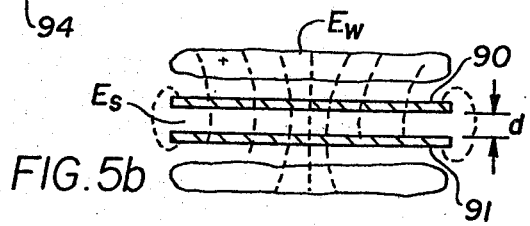

In operation, silane gas G is admitted to a pressure of about 0.4 Torr and, when electrodes 92, 94 have a minimum separation of ½", a RMS voltage of about 650 volts between electrodes 90, 91 from 60 Hz transformer 152 produces a current of 5 mA or about 0.2 mA/cm$^2$. These operating values are similar to those used with the DC supply of FIG. 1, except that each plate becomes cathodic alternately. As illustrated in FIG. 5b, the negative glow encircles plates 90, 91 in the weak electric field $E_w$ and for 178" separation d, a silane pressure of 0.35 Torr eliminates all glow-discharge in the strong field $E_s$. The actual operating pressure of 0.40 Torr allows some discharge to the inactive ends. The pressure used during deposition of the ohmic-layer and NH$_3$ treatment is determined separately.

In practice, I found that transformer 152 of the neon-sign type was convenient for developmental-size models. In production, larger, self-regulating SCR, or saturable reactor transformers can be used. Line frequencies (50–60 Hz) and audio frequencies to 20 KHz, which are supplied from inexpensive solid state supplies, are the preferred power sources.

Figure 6:
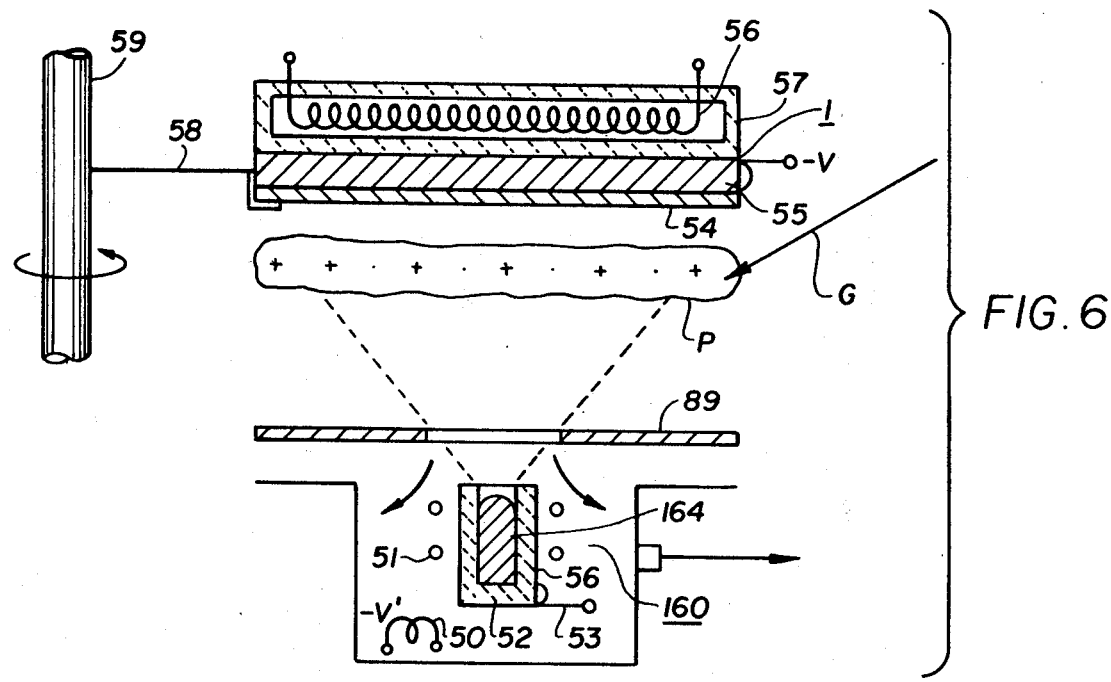
FIG. 6 illustrates another embodiment in which semiconductor material is evaporated through the glow-discharge to stabilize the discharge and attain desired semiconducting properties.

Referring to FIG. 6, an e-beam evaporation source 160 (commercially available) having an electron gun 50, magnetic deflector 51, and crucible 52 with electrical contact 53, is used to evaporate polycrystal (pxSi) 164 through a glow-discharge P onto substrate 1. Substrate 1 is comprised of stainless steel plate 54 retained on electrode 55 and heater 56 in ceramic enclosure 57 as discussed in connection with FIG. 1, however, electrodes 54, 55 are attached to arm 58 mounted on shaft 59. Shaft 59 may be rotated by a conventional mechanism (not shown) to move plate 54 from the coating region above source 160 to the vacuum metallization region (not shown) to apply electrodes as described in connection with FIG. 2a, b or the TiO$_2$ barrier layer, as described in connection with FIG. 2c. Baffle plate 89 and a high-capacity blower-pump (not shown) permit a low pressure in the evaporator region 160 and a higher pressure in the glow-discharge region P around substrate 1.

In operation, the crucible 56 may be grounded by lead 53 and a potential $-V$ is applied to substrate 1 to maintain the glow-discharge P in gases G. A negative potential $-V'$ may be applied to the e-beam source 50 to bombard and heat crucible 56, or other suitable heat sources may be used to heat crucible 56 to evaporate silicon 164. Evaporated Si passes through the glow-discharge P where it is partially ionized and joins the silane ions to coat the surface of plate 55. The evaporated material stabilizes the glow-discharge P and improves the semiconducting properties of the coating on plate 55. Gases G may be doped, undoped, or NH$_3$ as discussed in connection with FIG. 1. However, additional doping may be applied from the material in crucible 56. Also, any of the structures illustrated in FIGS. 2a, b, c may be formed and ammonia may be added without operating evaporation source 160.

Figure 7:
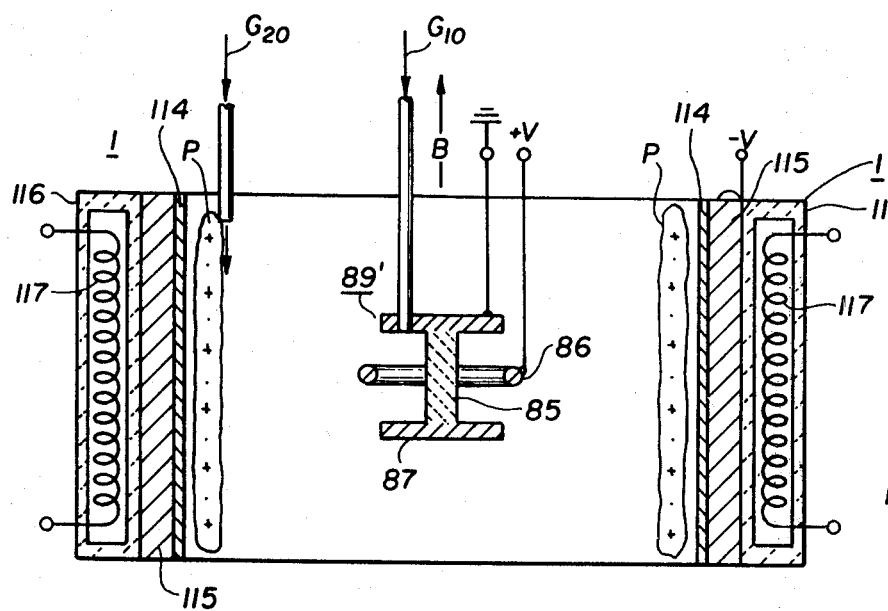
FIG. 7 illustrates another embodiment in which semiconductor material is sputtered through the glow-discharge to stabilize the discharge and attain desired semiconductor properties.

Referring to FIG. 7, a sputtering source 89 of the inverted magnetron type such as I described with E. G. Linder and E. G. Apgar in *Proceedings of the IRE* (now IEEE) (July 1952), pages 818–828. The source 89 has a cylindrical electrode 85 composed of poly-crystal Si, end plates 87, anode ring 86, and magnetic field B with its principle component longitudinal to the axis of the electrode 85. The substrate 1 has plates 114, electrodes 115, heater dielectric 116 and element 117 similar to substrate 1 described in connection with FIG. 1. Substrate 1 is positioned to receive silicon sputtered from electrode 85. A potential $-V$ relative to ring 86 maintains a glow-discharge in input-gases G in the vicinity of the surface of plate 114.

In operation, gases G10 such as Ar or Ar+H$_2$ are injected between magnetron electrodes 85, 86. A suitable potential, $+V$, on anode 86 and magnetic field B are maintained to sputter silicon onto the surface of plate 114. At the same time, a potential $-V$ is applied to substrate 1 relating to electrode 85 to maintain a glow-discharge P in gases G10 and sputtered silicon from source 85. The potential $-V$ is maintained until the ions is glow-discharge P deposit on substrate 114 to form a film of the desired thickness. Silicon from the sputter source 89 facilitates maintainance of a uniform glow-discharge in the vicinity of substrate 1 and improves conductivity characteristics of Schottky barriers such as illustrated in FIG. 2a, b, c.

Although I have used for convenience silane gases in the illustrations, other silicon-hydrogen gases can be used such as SiHCl$_3$ and SiH$_2$Cl$_2$. Also, other semiconductor gases such as germane can be used to form hydrogenated amorphous germanium. Non-hydrogenated semiconductors can also be used with the present invention including the binary alloys of gallium. For example, trimethylgallium gas glow-discharged with several other gases forms semiconductor films with arsene, forms GaAS; with NH$_3$, forms GaN; and, with PH$_3$ forms GaP. Apparatus illustrating other devices utilizing such semiconductor films are shown in FIG. 5. and the other drawings.

Figure 8:
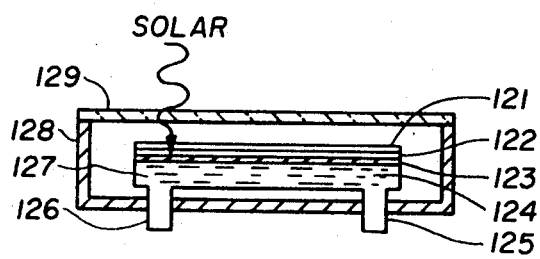
FIGS. 8 and 9 illustrate two embodiments of use of the invention as solar energy collectors.

Referring to FIG. 8, a solar thermal-collector is shown with a 1 μm a-Si film 121 and a-Ge film 123 coated on the front of stainless-steel plate 123 assembly which faces the solar radiation. Water 124, is circulated by input tubing 125 and output tubing 126 through enclosure 127 where it contacts the rear of plate 123. Transparent glazing 127, such as plate-glass, and enclosure 128 holds and insulates plate assembly 124 which is elevated in temperature by the solar radiation.

Under illumination, the visible solar radiation component which passes through glazing 12 is absorbed in the a-Si coating 121. The infra-red (IR) component of the solar radiation passes through the a-Si coating 121 and is absorbed in the a-Ge coating 122. Plate 123, preferably, has a polished or metallized surface with low IR emissivity for radiation wavelengths above say 2 μm–which would otherwise be radiated from the solar-heated plate 123, itself. Thus, the a-Si absorbs visible radiation whereas a-Ge, which has a smaller band gap than a-Si, absorbs the IR component. The a-Si, a-Ge films 121, 122 in combination yield close to the ideal characteristics of a solar thermal-collector-high absortivity and low IR emissivity. Any of the processes described above may be used to coat the a-Si and a-Ge layers 121, 122. Also, the coated plate assembly 123 may be used separately without glazing 129 and box 128 as a selective surface in a focused collector (not shown). It should be noted that both a-Si and a-Ge formed in my apparatus absorb more efficiently than crystal Si or Ge, and cost substantially less than crystals. Another application of films made with the process is shown in FIG. 9.

Figure 9:
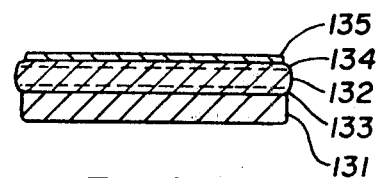

Referring to FIG. 9, a p-n junction is shown with a stainless steel substrate 131 coated with a-Si film 132 which has a heavily doped n+ layer making ohmic-Contact with plate 131 as described in connection with FIG. 1. A p (or pp+) layer 134 is added to coating 132 forming a p-n junction. Top Cr contact layer 135 may be semi-transparent, if the device of FIG. 9 is operated as a solar cell. Alternate substrate 131 surfaces include alloys of antimony (Sb) and gold (Au).

Other applications of the coating process and the improved barrier-layer are field-effect-transistors FET, insulated-gate-field-effect-transistors IGFET, and charge-coupled-devices CCD.

I claim:

1. Apparatus for producing a film on the surface of a substrate comprising: an evacuable enclosure, means for evacuating said enclosure, an external source of gaseous film-forming material, means for introducing into the evacuated enclosure said gaseous film-forming material at subatmospheric pressure in the region of said substrate, means for applying to the surface of said substrate a spatially non-uniform electric field having a weak field region extending over a portion of said substrate, and means for controlling said pressure to maintain a glow discharge in said weak field region adjacent said portion of said substrate to produce a substantially uniform film on said portion of said substrate.

2. The apparatus of claim 1 further comprising means for moving said substrate relative to said non-uniform electric field.

3. The apparatus of claim 1 in which said gaseous material comprises a semiconductor film forming material and further comprising means for heating said substrate to induce a high dark resistivity in said film.

4. The apparatus of claim 1 wherein said means for introducing said gaseous material comprises means for introducing a gaseous material comprising silicon and hydrogen.

5. The apparatus of claim 1 wherein said means for introducing said gaseous material comprises means for introducing gaseous germanium.

6. The apparatus of claim 1 wherein said means for introducing said gaseous material comprises means for introducing a gaseous material comprising silicon, hydrogen and a halogen.

7. The apparatus of claim 1 wherein said means for introducing said gaseous material comprises means for introducing a gaseous semiconductor dopant.

8. The apparatus of claim 1 wherein said substrate comprises stainless steel.

9. The apparatus of claim 1 wherein said substrate comprises glass coated with a conducting metal oxide.

10. Apparatus for producing a semiconductor film on the surface of a substrate in an evacuable enclosure comprising means for evacuating said enclosure, a first electrode structure having a substrate supporting surface, an external source of gaseous film-forming material, means for introducing said gaseous film-forming material at subatmospheric pressure into the evacuated enclosure in the region of said substrate supporting surface, a second electrode structure separated by a gap from said first electrode structure to apply to the surface of a substrate supported by said substrate supporting surface, a spatially non-uniform electric field having a strong field region across said gap and a weak field region extending over a portion of said surface of said substrate, and means for controlling said pressure to maintain a glow discharge in said weak field region adjacent said portion of said surface of said substrate to produce a substantially uniform semiconductor film on said portion of said surface of said substrate.

11. The apparatus of claim 10 in which said second electrode structure comprises an elongated planar member positioned substantially perpendicular to the tangent plane of said surface of said substrate.

12. The apparatus of claim 10 in which said second electrode structure comprises an elongated cylindrical member positioned substantially perpendicular to the tangent plane of said surface of said substrate.

13. The apparatus of claim 10 in which said second electrode structure comprises an elongated planar member positioned on the opposite side of said first electrode structure from said substrate supporting surface.

14. The apparatus of claim 10 in which said second electrode structure has a concave surface facing said surface of said substrate.

15. Apparatus for producing a coating on the surface of a substrate in an evacuable enclosure comprising means for evacuating said enclosure, an external source of gaseous film-forming material, means for ionizing said gaseous film-forming material at subatmospheric pressure, electrode means for applying a spatially non-uniform electric field having a weak field region extending over a portion of said substrate surface, and means for controlling said pressure to collect said ionized material on said portion of said substrate surface adjacent said weak field region to produce a substantially uniform semiconductor film on said surface.

16. The apparatus of claim 1 further comprising a thermal source of semiconductor film forming vapor positioned in the region of said substrate surface to diffuse said vapor into said weak field region adjacent said substrate surface.

17. The apparatus of claim 1 further comprising a body of solid semiconductor material disposed in said evacuated enclosure and means for applying a glow discharge to said body of solid semiconductor material to sputter said semiconductor material into said weak field region whereby said semiconductor material is deposited on said portion of said substrate.

18. The apparatus of claim 1 in which said means for applying said spatially non-uniform electric field comprises a source of direct current.

19. The apparatus of claim 1 in which said means for applying said spatially non-uniform electric field comprises a source of alternating current.

20. The apparatus of claim 1 in which said means for applying said spatially non-uniform electric field comprises a combination of direct and alternating current sources.

21. The apparatus of claim 2 further comprising: a second evacuable enclosure, means for evacuating said enclosure, an external source of a second gaseous film-forming material, means for introducing into the second evacuated enclosure said second gaseous film-forming material and wherein said moving means comprises means for moving said substrate between said evacuated enclosure and said second evacuated enclosure.

22. The apparatus of claim 21 wherein said means for introducing said gaseous material comprises means for introducing a gaseous, semiconductor film-forming material of one conducting type into an evacuated enclosure and said means for introducing a gaseous material into said second enclosure comprises means for introducing a gaseous semiconductor film-forming material of a second conducting type.

23. The apparatus of claim 21 wherein said means for introducing said gaseous material into said evacuated enclosure comprises means for introducing gaseous silicon and hydrogen into said evacuated enclosure and said means for introducing said second gaseous material into said second evacuated enclosure comprises means for introducing gaseous silicon, hydrogen and a dopant into said second evacuated enclosure.

* * * * *